United States Patent [19]

Marcyk et al.

[11] Patent Number: 6,121,144
[45] Date of Patent: Sep. 19, 2000

[54] LOW TEMPERATURE CHEMICAL MECHANICAL POLISHING OF DIELECTRIC MATERIALS

[75] Inventors: Gerald Marcyk, Beaverton; Ken Cadien, Portland, both of Oreg.

[73] Assignee: Intel Corporation, Santa Clara, Calif.

[21] Appl. No.: 08/999,019

[22] Filed: Dec. 29, 1997

[51] Int. Cl.[7] .............. B24B 49/14; B44C 1/22; H01L 21/302
[52] U.S. Cl. ................. 438/692; 216/89; 451/7
[58] Field of Search .......... 216/88, 89; 438/692, 438/693; 451/7; 156/345 LP

[56] References Cited

U.S. PATENT DOCUMENTS

| | | | |
|---|---|---|---|
| 4,450,652 | 5/1984 | Walsh | 451/7 |
| 5,476,817 | 12/1995 | Numata | 438/619 |
| 5,851,846 | 12/1998 | Matsui et al. | 438/17 |

*Primary Examiner*—Randy Gulakowski
*Assistant Examiner*—Shamim Ahmed
*Attorney, Agent, or Firm*—Blakely, Sokoloff, Taylor & Zafman LLP

[57] ABSTRACT

The present invention is an improved apparatus and process for chemical mechanical polishing layers which have a low dielectric constant (K). The present invention lowers the temperature of the material having a low dielectric constant and then polishes that material at the lower temperature. By lowering the temperature of the low K material the hardness or stiffness of the material is improved making it easier to polish and resulting in a more planar surface.

6 Claims, 4 Drawing Sheets

LOW TEMPERATURE CHEMICAL MECHANICAL POLISHING OF DIELECTRIC MATERIALS

BACKGROUND OF THE INVENTION

1. Field of the Invention

This invention relates to the field of semiconductor devices, and more specifically, to a process and apparatus for chemical mechanical polishing.

2. Background Information

Integrated circuits manufactured today are made up of literally millions of active devices such as transistors and capacitors formed in a semiconductor substrate. These active devices are formed and interconnected in an elaborate system of layers. A considerable amount of effort in the manufacture of modern complex, high density multilevel interconnections is devoted to the planarization of the individual layers of the interconnect structure. Nonplanar surfaces create poor optical resolution of subsequent photolithographic processing steps. Poor optical resolution prohibits the printing of high density interconnect metal lines. Another problem with nonplanar surface topography is the step coverage of subsequent metallization layers. If a step height is too large there is a serious danger that open circuits will be created. Planar interconnect surface layers are a must in the fabrication of modern high density integrated circuits.

To ensure planar topography, various planarization techniques have been developed. One approach, known as chemical mechanical polishing, employs polishing to remove protruding steps formed along the upper surface of interlayer dielectrics (ILDs). Chemical mechanical polishing is also used to "etch back" conformally deposited metal layers to form planar plugs or vias. FIG. 1 illustrates a typical chemical mechanical polisher 100. As shown, a substrate (or wafer) 110 is held by a carrier 120. Carrier 120 presses wafer 110 against polishing pad 130 that is attached to polishing platen 140. Polishing pad 130 is covered with an active slurry 150 and polishing platen 140 rotates in one direction while carrier 120 rotates in the opposite direction. The rotational motion, surface of the polishing pad, and slurry act together to polish or planarize the surface of wafer 110 at ambient temperature (i.e. room temperature).

However, as semiconductor devices become smaller and more dense chemical mechanical polishing is causing some problems with newer materials used to fabricate current semiconductor devices. Prior art materials used in conjunction with chemical mechanical polishing have been relatively hard and/or stiff materials such as oxides, polysilicon, etc. As a result, chemical mechanical polishing processes have been optimized for these materials.

New materials, such as materials with low dielectric constants are being used in order to reduce the RC Time Constant in current semiconductor devices. The RC Time Constant is the fundamental limit of a microprocessor caused by the capacitance between the metal lines of the microprocessor. There are two things which determine the RC Time Constant: the resistance of the metal lines themselves and the capacitance of the dielectric materials.

Silicon dioxide, which is widely used as a dielectric material has a dielectric constant (k) of approximately k=4. However, by switching to materials with lower dielectric constants, for example in the range of approximately k=2–3, several advantages may be obtained. The use of low k polymers have been found reduce the RC Time Constant due to a decreased capacitance and therefore increase the speed of the device. The use of low k materials have also been found to improve power dissipation, and reduce crosstalk noise between metal lines.

Unfortunately, low k materials tend to be more polymers which are more plastic like materials. Therefore, when polishing such low k materials in chemical mechanical polishing, because they are plastic, they tend to bend and/or deform causing bad results and bad uniformity during planarization.

FIG. 2 illustrates a low k material after planarization with prior art chemical mechanical polisher and polishing method. As shown, low k material 210 was deposited above metal lines 220 and substrate 200. Since low k material 210 is somewhat plastic it deformed during the chemical mechanical polishing process. As illustrated, because low k material 210 deformed during polishing the top surface is not uniform and is not evenly planarized.

Thus, what is needed is a chemical mechanical polisher and polishing process that will enable the planarization of low k materials with good results and uniformity.

SUMMARY OF THE INVENTION

The present invention is a method and apparatus for planarizing by lowering the temperature of the material to be polished and polishing that material at the lowered temperature.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

Figure 1:
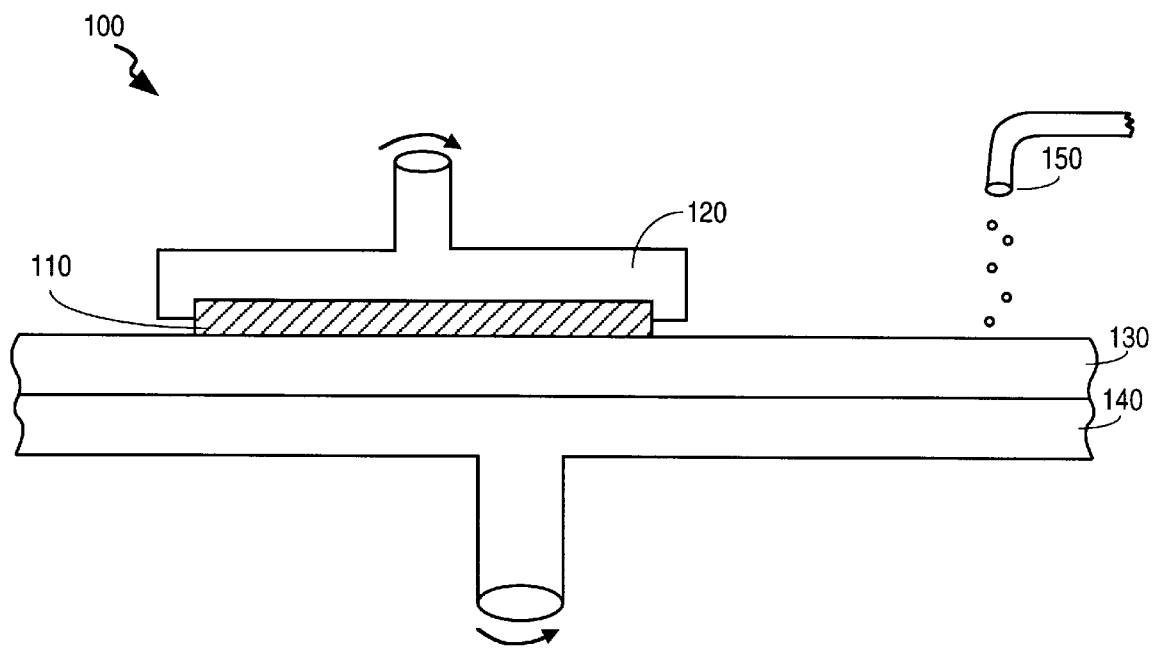
FIG. 1 illustrates a typical chemical mechanical polisher used in the prior art.
Figure 2:
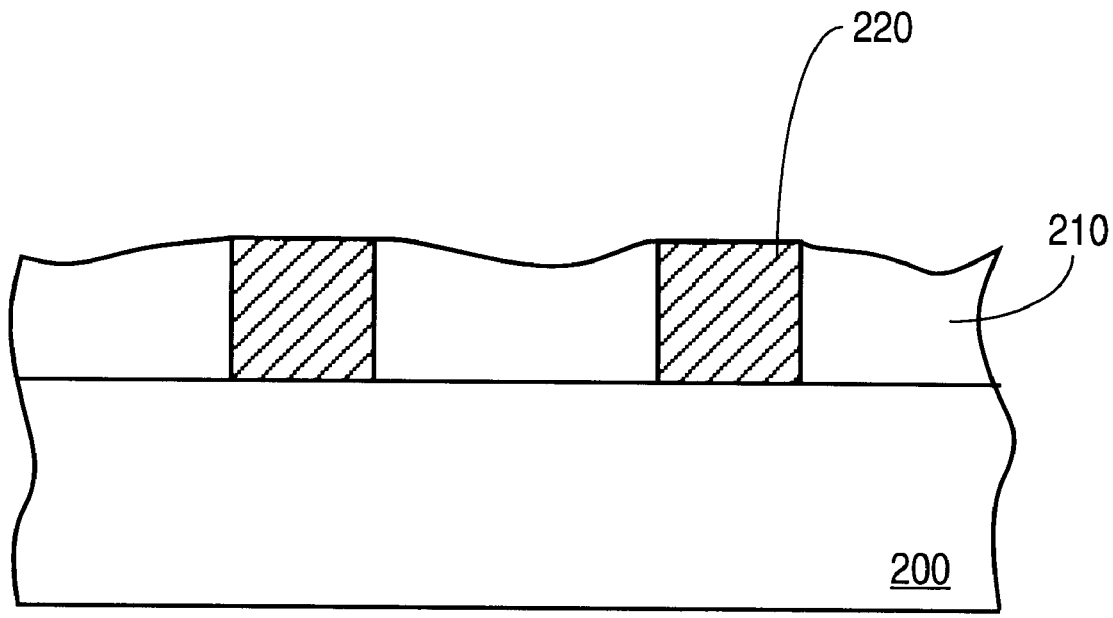
FIG. 2 illustrates a low k material after planarization with prior art chemical mechanical polisher and polishing method.

A Process and Apparatus for Low Temperature Chemical Mechanical Polishing of Dielectric Materials is disclosed. In the following description, numerous specific details are set forth such as specific materials, process parameters, equipment, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is an improved apparatus and process for chemical mechanical polishing layers which have a low dielectric constant (k). The present invention lowers the temperature of the material having a low dielectric constant and then polishes that material at the lower temperature. By lowering the temperature of the low k material the hardness (or stiffness) of the material is improved making it easier to polish and resulting in a more planar surface.

It should be noted that, the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn so as to illustrate the important features of the invention.

It should also be noted that, reference to a substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SIO) devices, or substrates for processing other apparati and devices such as flat panel displays, multichip modules, etc.

As stated in the background of the invention, low k dielectric materials, such as polymers, are being used in order to reduce the RC Time Constant and to improve the performance of semiconductor devices. Such low k materials however deform and/or bend in prior art chemical mechanical polishing (CMP) processes and apparati. Some examples of low k materials are polyarimatic ethers (PAEs) and paralene, both of which exhibit dielectric constants of approximately k=2.5.

In order to improve the planarization of low k materials the present invention lowers the temperature of the low k material during the CMP process. By deliberately lowering the temperature of the low k materials the materials become harder (or stiffer) which improves the results of polishing. As stated in the background of the invention prior art CMP processes are performed at ambient (or room) temperature. The present invention lowers the temperature of the CMP process below ambient (or room) temperature. For example, the temperature of the low k material may be lowered to a temperature in the range of approximately 5–65° C. It should be noted, however, that the temperature will be dependent upon the properties of the particular material being used.

Figure 3:
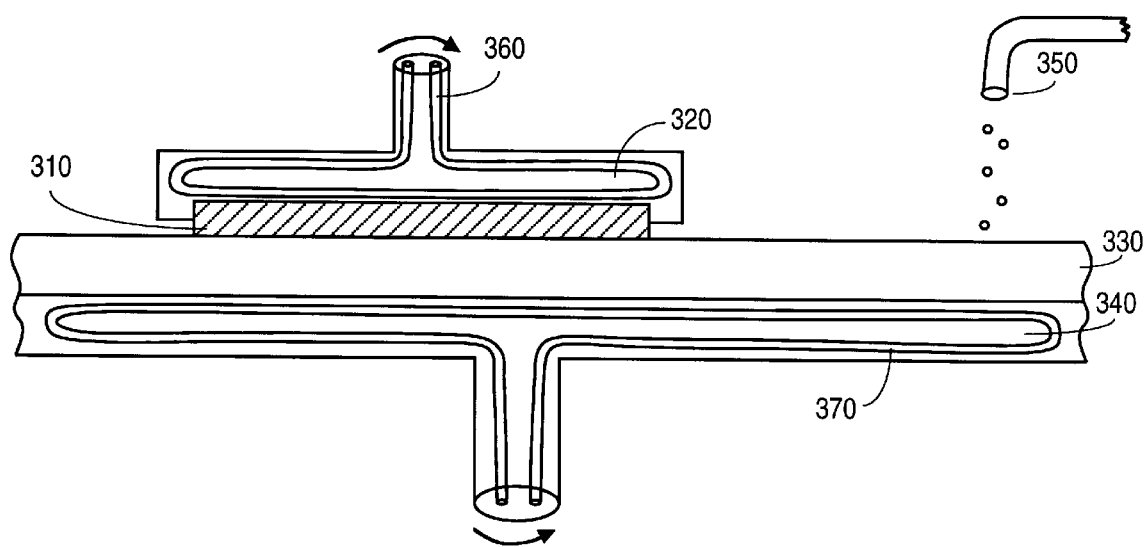
FIG. 3 illustrates a chemical mechanical polisher of the present invention.

FIG. 3 illustrates a chemical mechanical polisher 200 as used in an embodiment of the present invention. As shown, a substrate (or wafer) 310 is held by a carrier 320. Carrier 320 includes a chiller 360 to lower the temperature of wafer 310 and thereby lower the temperature of the low k material on the wafer 310. Chiller 360 may be a temperature controlled loop which circulates a cooled liquid or gas through the carrier. The lowered temperature of wafer 310 increases the hardness (or stiffness) of the low k material deposited thereon in order to improve the planarization of the CMP process.

Chemical mechanical polisher 200, as shown, also has a polishing platen 340 which includes a chiller 370. Chiller 370 is used to reduce the temperature of the polishing pad 330 thereby reducing the temperature of the CMP process. When carrier 310 presses wafer 310 against polishing pad 330 the lowered temperature of the polishing pad helps to lower the temperature of the low k material deposited on wafer 310. Thus, increasing the hardness (or stiffness) of the low k material during the CMP process.

An additional benefit of the embodiment having a chiller in the polishing platen is that the hardness of the polishing pad 330 may be increased by reducing the temperature of the polishing pad 330. In the prior art it was necessary to physically change the pad material in order to change the hardness of the polishing pad 330.

It should be noted that although chemical mechanical polisher of the present invention is depicted in FIG. 3 as having chillers in both the carrier and polishing platen the present invention may be performed by having the chiller in either the carrier or polishing platen and it is not necessary to include a chiller in both. It should also be noted that other methods and apparati for lowering the temperature of the low k material may be used in place of or in conjunction with the chiller (or chillers) illustrated in FIG. 3. For example, a temperature controlled slurry 350 (i.e. a slurry with a lowered temperature) may be used to lower the temperature of the polishing process and increase the hardness or stiffness of the low k material.

Figure 4:
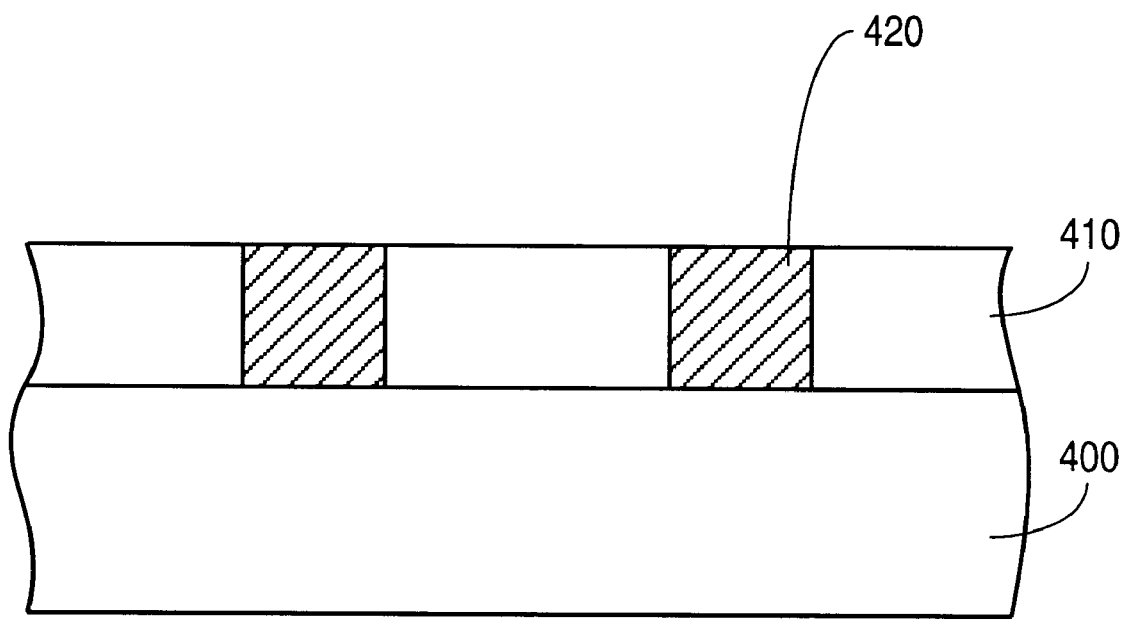
FIG. 4 illustrates a low k material after planarization with the chemical mechanical polishing apparatus and process of the present invention.

FIG. 4 illustrates a low k material after planarization with the chemical mechanical polishing apparatus and process of the present invention. As shown, low k material 410 was deposited above metal lines 420 and substrate 400. Since, with the use of the present invention, low k material 410 is harder (or stiffer) than it would be at room temperature it does not deform during CMP. As illustrated, because low k material 410 was harder during polishing with the present invention the top surface is uniform and is more evenly planarized.

Thus, a Process and Apparatus for Low Temperature Chemical Mechanical Polishing of Dielectric Materials has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for planarization comprising:

lowering the temperature of a material to be polished by chilling a wafer carrier and a polishing platen; and polishing said material at said lowered temperature.

2. The method as described in claim 1 wherein said material has a low dielectric constant in the range of approximately k=1–3.

3. The method as described in claim 1 wherein said material is a low k polymer.

4. The method as described in claim 3 wherein said material is selected from the group consisting of: paralene, PAE, and a combination thereof.

5. The method as described in claim 1 wherein said lowered temperature is less than ambient temperature.

6. The method as described in claim 1 wherein said step of polishing is a chemical mechanical polishing process.

* * * * *